(12) United States Patent
Forel et al.

(10) Patent No.: US 6,410,398 B1
(45) Date of Patent: Jun. 25, 2002

(54) DEVICE FOR THE ADJUSTMENT OF CIRCUITS AFTER PACKAGING, CORRESPONDING FABRICATION PROCESS AND INDUCTION DEVICE

(75) Inventors: Christophe Forel, Annonay; Sebastien Laville, Grenoble; Serge Pontarollo, St. Martin le Vinoux, all of (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/604,989

(22) Filed: Jun. 28, 2000

(30) Foreign Application Priority Data

Jun. 28, 1999 (FR) ............................................. 99 08240

(51) Int. Cl.⁷ ............................................... H01L 21/20
(52) U.S. Cl. ........................ 438/382; 438/383; 257/328; 257/335
(58) Field of Search ................................. 438/382, 383; 257/328, 648; 25/335

(56) References Cited

U.S. PATENT DOCUMENTS 5,539,327 A * 7/1996 Shigehara et al. ............ 326/30
6,169,309 B1 * 1/2001 Teggatz et al. ............. 257/328

* cited by examiner

*Primary Examiner*—David Nelms
*Assistant Examiner*—Reneé R. Berry
(74) *Attorney, Agent, or Firm*—Lisa K. Jorgenson; Allen, Dyer, Doppelt, Milbrath & Gilchrist, P.A.

(57) ABSTRACT

A process for forming an electrical resistance in an integrated MOS transistor includes applying a first voltage to the source and gate of the MOS transistor, and applying a second voltage to the drain of the MOS transistor. A prebiasing voltage is applied to the substrate of the MOS transistor to make the base/emitter junction of a parasitic bipolar transistor of the MOS transistor conduct. The first and second voltages are capable of initiating a breakdown of the MOS transistor by an avalanche of the drain/substrate junction, an irreversible breakdown of the drain/substrate junction, and a short circuit between the drain and the source.

21 Claims, 4 Drawing Sheets

DEVICE FOR THE ADJUSTMENT OF CIRCUITS AFTER PACKAGING, CORRESPONDING FABRICATION PROCESS AND INDUCTION DEVICE

FIELD OF THE INVENTION

The present invention relates to the field of analog and digital integrated circuits. These circuits must use as small an area of silicon as possible to reduce costs while maintaining high precision.

BACKGROUND OF THE INVENTION

The precision of eliminating circuits containing defects is excellent during the step of sorting silicon wafers. However, this precision may deteriorate during the subsequent encapsulation step.

By way of example, offset voltages in an operational amplifier are on the order of 2 mV during wafer sorting which, after adjustment, are brought back down to 1 mV. However, packaging or encapsulation creates an additional shift bringing the final offset voltage back to 1.5 mV.

For a voltage reference or voltage regulator, the precision during wafer sorting is 0.8%, which is reduced to 0.2% after adjustment. As in the case of an amplifier, packaging introduces a shift bringing the final precision to 0.5%.

SUMMARY OF THE INVENTION

An object of the present invention is to adjust integrated circuits after they have been packaged, especially standard low-cost integrated circuits produced in high volume. A very high precision is to be obtained, which is at least equal to that obtained after adjustment during wafer sorting.

The process according to one aspect of the invention is intended for the formation of an electrical resistor in an integrated MOS transistor. A first voltage is applied to the source and the gate of the MOS transistor. A prebiasing voltage is applied to the substrate to make the base/emitter junction of a parasitic bipolar transistor of the MOS transistor conduct. A second voltage is applied to the drain of the MOS transistor. The first and second voltages are capable of initiating a breakdown of the MOS transistor by the following: an avalanche of the drain/substrate junction; an irreversible breakdown of the drain/substrate junction; and a short circuit between the drain and the source.

In one mode of implementation, the application of the first and second voltages takes place before the step of encapsulating a circuit that includes the MOS transistor. In a preferred mode of implementation, the application of the first and second voltages takes place after the step of encapsulating a circuit that includes the MOS transistor. The breakdown of the MOS transistor may be induced via the existing pins of the integrated circuit including ground pins, power supply pins, input pins, and output pins.

In another mode of implementation, one of the first and second voltages is constant and the other voltage is a monotonically changing ramp. In yet another mode of implementation, the first voltage is constant and the second voltage is a ramp. The ramp will be positive for an n-MOS transistor and vice versa for a p-MOS transistor. The difference between the first and second voltages may be less than 10 volts, and preferably less than 9 volts. The breakdown current may be less than 2 mA.

The present invention is also directed to an integrated electronic circuit provided with a MOS transistor. The integrated circuit comprises a first resistor placed between the substrate and the source of the MOS transistor, and a second resistor and a diode placed in series between the substrate and the drain. The gate and the source are short-circuited so that application of a voltage between the drain and the source biases the base/emitter junction of the parasitic bipolar transistor of the MOS transistor. The MOS transistor breaks down by the following: an avalanche of the drain/substrate junction, an irreversible breakdown of the drain/substrate junction, and a short circuit between the drain and the source. The resistive value of the component forming a resistor for the MOS transistor is determined by the current due to the voltage.

The base of the parasitic bipolar transistor is formed by the substrate, the collector is formed by the drain, and the emitter is formed by the source. The diode may be connected in such a way that it allows a current to flow from the drain to the substrate.

The present invention is also directed to an induction device for inducing the breakdown of a circuit as described above. The device comprises an analog/digital converter for the voltage applied to each input of the device, and a generating circuit or means for generating a voltage for controlling a switch. The generating means is connected to the output of the converter. A switch controlled by the generating means has one terminal connected to a supply and another terminal connected to the circuit.

Advantageously, the device comprises a reversible turn-off circuit or means capable of acting on the generating means. Advantageously, the device also comprises an irreversible turn-off circuit or means capable of acting on the generating means. The turn-off means comprises a circuit that is able to break down, and may be capable of turning off all the switches.

The circuit may comprise a diode such as a Zener diode, for example, or a transistor such as a MOS transistor, for example. The circuit may also comprise a MOS transistor. The circuit may comprise a first resistor between the substrate and the source of the MOS transistor. The circuit may comprise a second resistor and a diode in series between the substrate and the drain, with the gate and the source being short-circuited so that the application of a voltage between the drain and the source causes the base/emitter junction of the parasitic bipolar transistor of the MOS transistor to be biased. The MOS transistor breaks down by avalanche of the drain/substrate junction, the irreversible breakdown of the drain/substrate junction, and a short circuit between the drain and the source. The component forms a resistor having a value defined by the current due to the voltage.

The invention therefore makes it possible to provide standard integrated circuits with enhanced precision. The use of a so-called "snap-back" MOS transistor makes it possible to obtain a short circuit, and therefore obtain a resistor within an integrated circuit after it has been encapsulated by acting on the existing pins of the integrated circuit.

The component thus produced occupies only a small area on a silicon wafer in the sense that it comprises only one MOS transistor. The fact that the gate and the source of the MOS transistor are short-circuited ensures that it is permanently turned off and prevents it from having any influence on the operation of the adjacent electronic circuits.

After breakdown, the component may be likened to a turned-off MOS transistor. The diode makes it possible to avoid a leakage current during steady-state operation in those parts of the circuit to be adjusted. These parts of the circuit in general are operating at a voltage of a few millivolts, and more generally, at a voltage below the threshold voltage of the diode.

The invention draws benefit from a natural characteristic of MOS transistors, which is to have parasitic components, particularly a bipolar transistor. In some configurations, these parasitic components are harmful. During electrostatic discharges, circuits may be seriously damaged by the parasitic transistor being turned on.

On the other hand, the present invention uses the parasitic bipolar transistor of the MOS transistor to make a short circuit and obtain a resistor of predetermined value between the drain and the source of the MOS transistor. That is, between the collector and the emitter of the parasitic bipolar transistor. This component may be regarded as an anti-fuse. This is because a fuse is a closed circuit in the normal state and an open circuit after breakdown. Here, the component is an open circuit before breakdown (turned-off MOS transistor) and a closed circuit after breakdown with a low residual resistance value.

BRIEF DESCRIPTION OF THE DRAWINGS

The present invention will be more clearly understood on studying the detailed description of a few embodiments taken as entirely non-limiting examples and illustrated by the appended drawings in which.

DETAILED DESCRIPTION OF THE PREFERRED EMBODIMENTS

Figure 1:
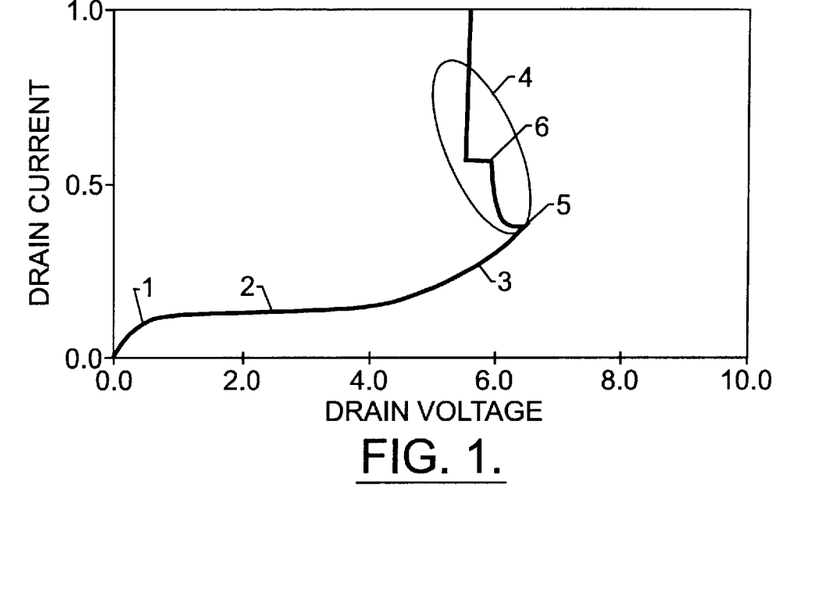
FIG. 1 is a characteristic curve of the operation of an n-MOS transistor in accordance with the present invention.

As may be seen in FIG. 1, in which the drain voltage is plotted on the x-axis and the drain current is plotted on the y-axis, an n-MOS transistor has four operating regions. Region 1 is that of the conventional linear operation of a MOS transistor. Region 2 is that of the operation in a saturated mode, in which the current changes only very slightly with voltage. Region 3 is called the avalanche region with a weakening of the drain/substrate junction caused by the avalanche of the junction. Finally, region 4 is that of the conduction of the parasitic bipolar transistor with a first breakdown labeled 5 on the curve which is reversible, and a second breakdown labeled 6 on the curve which is destructive, and therefore, irreversible.

Beyond the second breakdown 6, it may be seen that the current increases extremely rapidly with voltage. The slope of the curve is almost vertical. This breakdown process, also called a second breakdown, is irreversible. Beyond the breakdown 5, called snap-back, the curve shows a decrease in the resistance of the MOS transistor. For an approximately constant drain voltage, it may be seen that the current increases. The choice of breakdown current makes it possible to determine, to a certain extent, the value of the resistor of the broken-down MOS transistor after the breakdown 6. This is under normal operating conditions.

Figure 2:
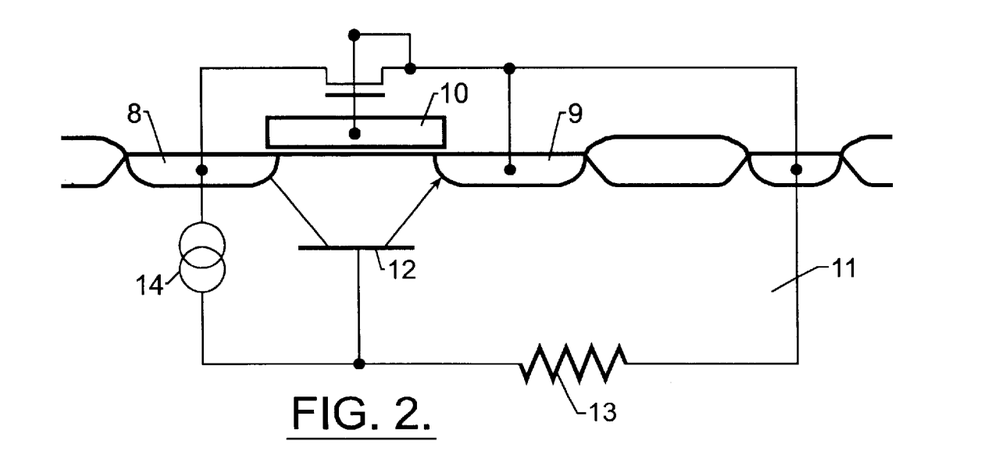
FIG. 2 is a cross-sectional view of a MOS transistor in accordance with the present invention.

FIG. 2 shows the structure of the various parts of the MOS transistor. The MOS transistor comprises a drain 8, a source 9 and a gate 10 which are formed on a substrate 11. Present in the substrate 11 is a parasitic bipolar transistor 12 whose collector is formed by the drain 8, whose emitter is formed by the source 9 and whose base is the substrate 11. The distance separating the active base, i.e., between drain and source, and the base contact is modeled by a substrate resistor 13. A current source 14 between the resistor 13 and drain is used to model the natural characteristics of the MOS transistor.

Figure 3:
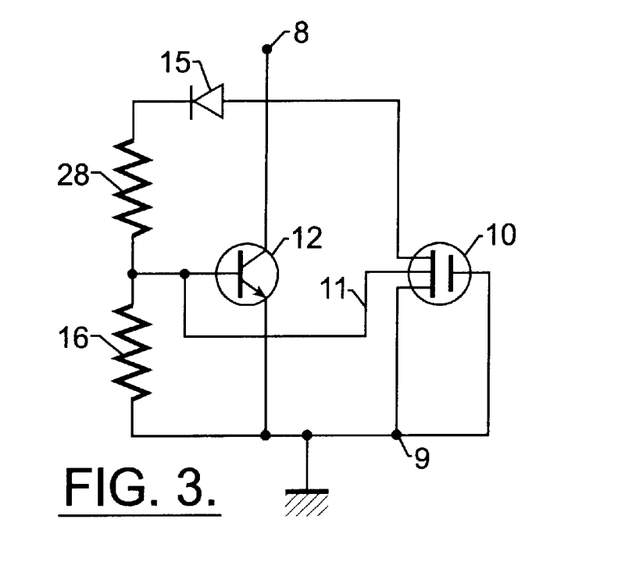
FIG. 3 is a diagram of the component according to the present invention with the MOS transistor and its parasitic bipolar transistor.

In the diagram according to the present invention illustrated in FIG. 3, the substrate 11 is connected to the drain 8 via a resistor 28 and a diode 15. The diode 15 allows a current to flow from the drain 8 to the substrate 11, but prevents it from flowing in the opposite direction. A resistor 16 is placed between the base of the parasitic bipolar transistor 12 and the source 9. The source is connected to the emitter of the parasitic bipolar transistor 12. The resistor 16 makes it possible to achieve a good equipotential for the base/emitter junction of the parasitic bipolar transistor.

In the steady state and in the absence of breakdown, the circuit portion in parallel with the adjustment device is subjected to a voltage. The voltage may be, for example, on the order of 100 mV. This is below the threshold voltage of the diode 15 which prevents the appearance of a leakage current from the drain to ground. The resistor 16 makes it possible to draw off some of the possible leakage current from the diode 15 so that the base current of the parasitic bipolar transistor is as low as possible.

The drain 8 is connected to a first supply voltage, while the source 9 and the gate 10 are short-circuited and connected to ground. By applying a high voltage between the collector and the emitter, this voltage is divided between the two junctions. The emitter-base junction is slightly forward-biased and injecting, into the base, electrons which, after passing through the base, add to the leakage current of the base-collector junction. Thus, by biasing the substrate, the base-emitter junction is turned on without there having been a total avalanche of the collector-base junction. The breakdown phenomenon then occurs. The fact of adding current to the leakage current of the base-collector junction makes it possible to reduce both the breakdown voltage and the breakdown current of the component.

The component reverts to a second, irreversible breakdown mode, which results in heat-up and destruction of the crystal lattice. Next, a polysilicon resistor is created between the drain and the source. To initiate the avalanche phenomenon, a large enough voltage must be imposed on the drain. This voltage depends on the doping characteristics and on the gain of the parasitic bipolar transistor, and is proportional to the square of the electric field.

By way of example, tests have been carried out in HF4CMOS technology with an n-MOS transistor whose channel has the following dimensions: width=1 mm, and length=0.7 mm. The source is grounded and a voltage ramp rising up to 9.5 volts is applied to the drain with current limitation. For a 2 mA collector current, a post-breakdown resistance of 11 ohms is obtained with a base current in the region of 100 mA, and in all cases between 60 and 160 mA.

It is suitable to use a voltage ramp with a steep slope, which makes it possible to reduce the duration of the breakdown process and to guarantee a satisfactory breakdown. Within a certain range, the value of the resistor is independent of the collector current. Thus, it is possible to create the breakdown with a voltage of less than 10 volts, which does not carry the risk of damaging the integrated circuit in HF4CMOS technology, or in other technologies withstanding only low voltages of course, what has been described with an n-MOS transistor also applies to the case of the p-MOS transistor. More generally, the invention makes it possible to obtain a breakdown voltage compatible with the voltage limit of the integrated circuit, with the voltage limit being based upon the technology of the integrated circuit.

It is particularly advantageous to use transistors whose channel is as short as possible. The shorter the channel the lower the breakdown voltage. This is on account of the increase in the drain current and the increase in the number of electron-hole pairs generated for a constant channel width. Decreasing the channel width results in a decrease in the voltage and of the current of the second breakdown 6 illustrated in FIG. 1. Even if the width of the channel does not fall within the voltage of the first breakdown 5, a reduced width will increase the thermal effect of the second breakdown 6 since the field lines are then more unidirectional. This implies a reduction in the coupling of the second breakdown. It is therefore particularly advantageous to use MOS transistors having small dimensions.

In practice, the creation of the resistor by the breakdown of the MOS transistor in an integrated circuit after encapsulation has to take place via the conventional pins used for the inputs, the outputs, the supply and ground without providing additional pins. Providing additional pins would be expensive and, subsequently, redundant. It is therefore possible to apply a constant positive voltage on the supply, and to apply a negative voltage ramp to ground with a current limitation to create the desired resistor. Such a resistor may be placed, for example, in the "feet" of a differential amplifier which, in general, forms the input stage of an operational amplifier. The term "foot" should be understood as meaning the active-load emitter terminal of the differential amplifier.

The invention thus makes it possible to take advantage of a natural characteristic of MOS transistors which is normally regarded as a drawback. This is done to create an integrated resistor to obtain integrated circuits produced in very high volume with a high precision.

Figure 4:
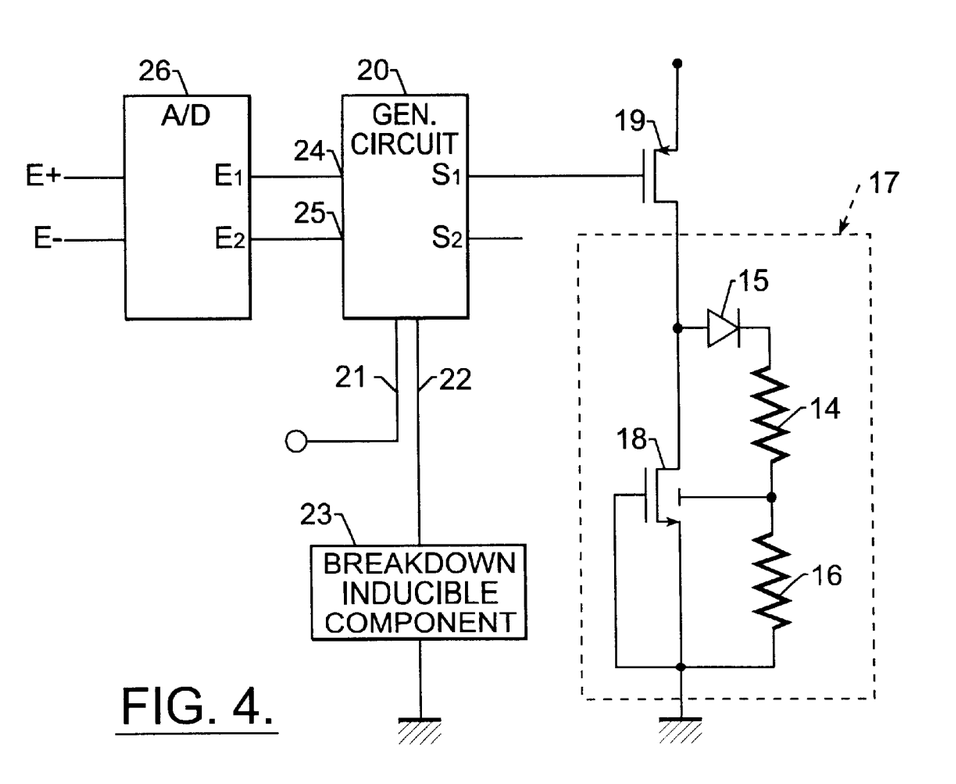
FIG. 4 is a diagram showing the component according to the present invention provided with breakdown-inducing means.

The breakdown of the MOS transistor in an integrated circuit after encapsulation requires suitable induction, as well as means for inhibiting the breakdown before encapsulation during wafer sorting. For this purpose, a structure as illustrated in FIG. 4 may be provided. The breakdown-inducible component 17 comprises an n-MOS transistor 18, a diode 15 and two resistors 28 and 16. These elements are placed, as explained above, for a breakdown with prebiasing of the base-emitter junction of the parasitic bipolar transistor. Using the induction device, it is also conceivable to induce breakdown in a MOS transistor whose substrate is connected to ground. This requires a higher breakdown voltage of about 16 volts, or else a Zener diode of even higher breakdown voltage, of about 24 volts, for example.

The breakdown-inducible component 17 (or the MOS transistor or the Zener diode) is connected to ground and to the drain of a p-MOS transistor 19. The source of the p-MOS transistor 19 is connected to a supply terminal and its gate is connected to a circuit or means 20 for generating a control voltage of course, other types of switches may be utilized instead of the transistor 19. The generating means 20 comprises a plurality of outputs $S_1, S_2, \ldots S_n$, each connected to the control input of a switch capable of inducing the breakdown of a breakdown-inducible component 17. For the sake of clarity, only a single component 17 whose breakdown is induced via the output $S_1$ has been shown in FIG. 4.

The generating means 20 is connected to a terminal 21 accessible during wafer sorting before encapsulation. This makes it possible to inhibit the generating means 20 by applying a predetermined voltage to temporarily prevent breakdown of a breakdown-inducible component 17, which is connected to one of the outputs $S_1, S_2, \ldots S_n$.

The generating means 20 comprises an input 22 connected to a breakdown-inducible component 23 which may be of the same type as the breakdown-inducible component 17, or a MOS transistor or a Zener diode. The breakdown-inducible component 23 is also connected to ground. The breakdown of the component 23 brings the voltage on the input 22 to that on the ground terminal. This prevents breakdown of the breakdown-inducible component 17 connected to one of the outputs $S_1, S_2, \ldots S_n$. This operation is carried out after the adjustment, which is carried out after encapsulation. This prevents any subsequent loss of adjustment by breakdown of one of the breakdown-inducible components 17 connected to one of the outputs $S_1, S_2 \ldots S_n$, especially by the user of the integrated circuit.

Preferably, the reversible inhibition terminal 21 is formed on the irreversible inhibition input 22, thereby making it possible to save space. During the wafer sorting, a given voltage is applied to the terminal 21. This given voltage is capable of temporarily preventing the breakdown of a breakdown-inducible component 17. In addition, this temporarily prevents the breakdown of the breakdown-inducible component 23 since the p-MOS transistor 19 forming a switch of the component 23 is turned off.

After encapsulation, the terminal 21 is no longer accessible and only a particular combination of voltages applied to the pins of the package containing the structure of FIG. 4 may cause the breakdown of the breakdown-inducible component 23. The breakdown of the component 23 causes all the outputs $S_1, S_2, \ldots S_n$ to go to a high level, hence turning off the MOS transistors 19 with almost zero consumption. This prevents the breakdown of component 17.

The generating means 20 is connected via two inputs 24, 25 to two outputs E1 and E2 of an analog-digital converter 26. The analog-digital converter 26 has two inputs $E^+$, $E^-$ which are connected, for example, to the inputs of an operational amplifier which it is desired to balance after encapsulation.

The two inputs $E^+$, $E^-$ each receive an analog voltage of between 0 and 10 volts, for example. The outputs $S_1$, $S_2, \ldots S_n$ have binary output levels, one capable of turning off the transistor 19 and the other of turning it on, and hence inducing breakdown of the breakdown-inducible component 17 connected to the corresponding output.

The analog-digital converter 26 carries out multiplexing with the following truth table:

| $E^+$ | $E^-$ | E1 | E2 |
|---|---|---|---|
| B | B | 0 | 0 |
| B | A | 0 | 1 |
| A | B | 1 | 0 |
| A | A | 1 | 1 |

With A<Vdd−Vtp and B>Vdd−Vtp, Vdd is the supply voltage and Vtp is the threshold voltage of the transistors of the analog-digital converter 26, for example, of the p-MOS type. Thus, with two inputs it is possible to make four combinations.

The following truth table makes it possible to generate the control signals for the breakdown-inducing transistors 19 via the generating means 20:

| E+ | E− | E1 | E2 | S1 | S2 | S3 | S4 |
|----|----|----|----|----|----|----|----|
| B  | B  | 0  | 0  | 0  | 1  | 1  | 1  |
| B  | A  | 0  | 1  | 1  | 0  | 1  | 1  |
| A  | B  | 1  | 0  | 1  | 1  | 0  | 1  |
| A  | A  | 1  | 1  | 1  | 1  | 1  | 0  |

To be able to initiate breakdown in a number of breakdown-inducible components greater than four, an analog-digital converter 26 capable of interpreting a higher number of voltage levels is used. The analog-digital converter 26 comprises at least two MOS transistors whose gates are connected to one of the inputs E+, E−. The sources are connected to the Vdd supply voltage and the drains forming the outputs are each connected to a current source. These MOS transistors have different width-to-length ratios so that they switch for different and staggered gate voltages. In the case of three MOS transistors per input E+, E−, switch voltages of −1.3 volts, −2.2 volts and −3.5 volts with respect to the supply voltage Vdd may be provided. The dual structure is possible. The switch voltages are, in this case, referenced with respect to ground.

In the case of a circuit to be adjusted which has a single input, the four regions with three structures in parallel make it possible to initiate breakdown in four breakdown-inducible components. One of which will be able to serve for the irreversible inhibition, such as the component 23 in FIG. 4. In the case of a circuit to be adjusted which has two inputs, the four regions per input make it possible to initiate breakdown in six breakdown-inducible components. One of which will be able to serve for the irreversible inhibition. In general, the number of components able to be initiated is equal to the number of inputs multiplied by the number of switching (MOS transistors) structures in parallel on each input increased by the number 1.

Figure 5:
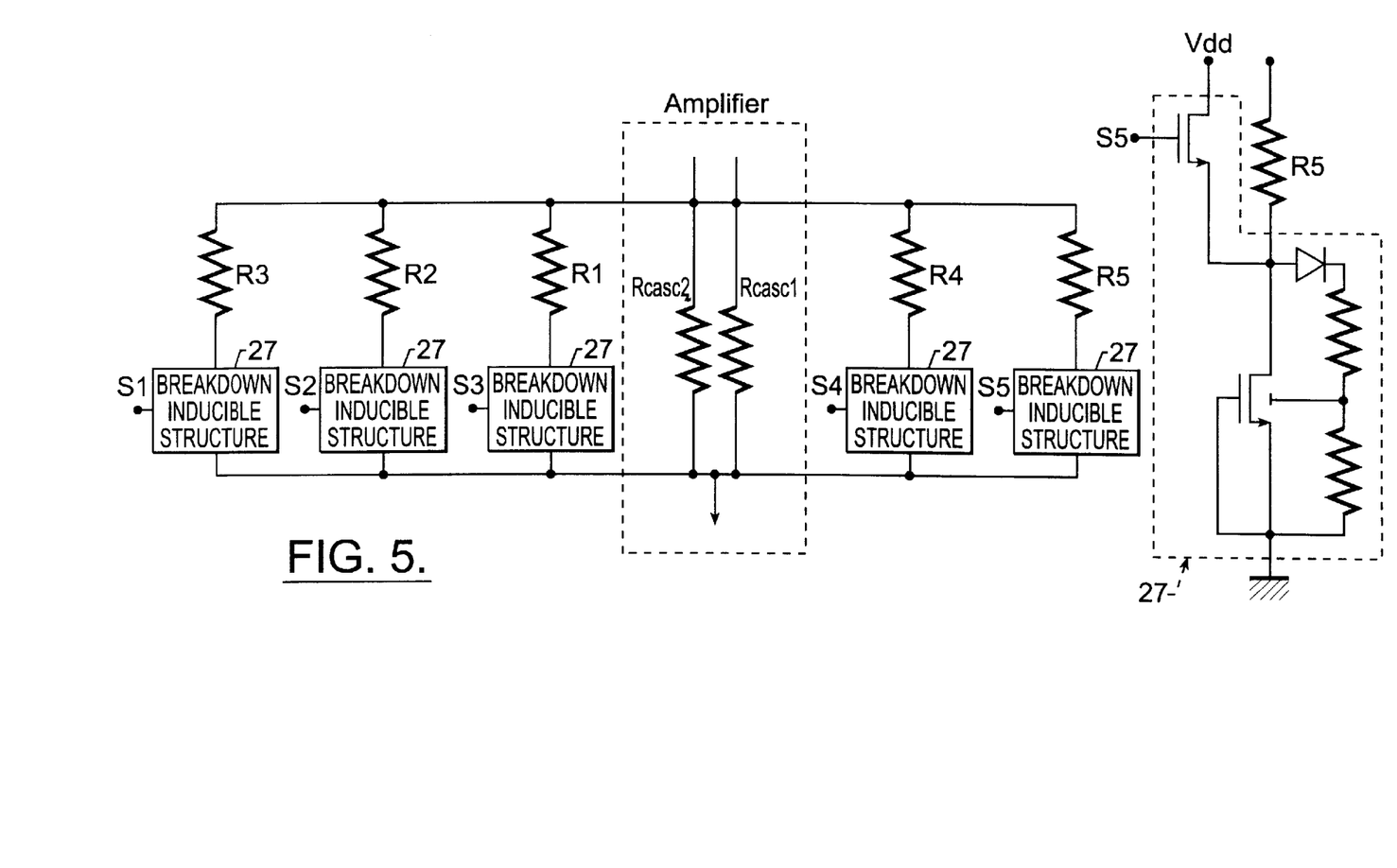
FIG. 5 is a diagram showing an example of how components according to the present invention are used.

FIG. 5 illustrates an example of an integrated circuit for adjusting the offset voltage of an operational amplifier comprising a cascode circuit as input. Only the resistors $R_{casc1}$ and $R_{casc2}$ of the cascode circuit are illustrated. These correspond to the inverting and non-inverting inputs of the amplifier, respectively. Two parallel branches are connected in parallel with the resistor $R_{casc1}$, and three parallel branches are connected in parallel with the resistor $R_{casc2}$.

The five branches are of similar construction. One branch comprises, in series, a resistor, $R_1$, $R_2$, $R_3$, $R_4$ or $R_5$ and a breakdown-inducible structure 27 comprising a breakdown-inducible component and its associated initiating switch. Each resistor $R_1$, $R_2$, $R_3$, $R_4$, $R_5$ is in series with a breakdown-inducible component but not with the corresponding initiating switch. By selectively choosing the values of the resistors $R_1$, $R_2$, $R_3$, $R_4$, $R_5$ it is possible to obtain a wide range of resistance values after breakdown, $R_{bd1}$ and $R_{bd2}$, on each input of the amplifier. It is also possible to correct adjustment defects in the offset voltage in a precise manner and over a wide range. Thus:

$$R_{bd1}=1/(1/R_{casc1}+1/(R_1 \text{ or } \infty)+1/(R_2 \text{ or } \infty)+1/(R_3 \text{ or } \infty))$$

$$R_{bd2}=1/(1/R_{casc2}+1/(R_4 \text{ or } \infty)+1/(R_5 \text{ or } \infty))$$

Each branch thus has an infinite resistance, denoted by ∞, if its structure 27 has not undergone breakdown. Each branch has a resistance equal to the sum of the resistance of the structure 27 that has undergone breakdown, e.g., 11 ohms, and of the resistance of the resistor $R_1$, $R_2$, $R_3$, $R_4$, $R_5$. In practice, the resistance is approximately equal to the resistance of the resistor $R_1$, $R_2$, $R_3$, $R_4$, $R_5$ which is of a markedly higher value on the order of a few kilohms or a few tens of kilohms.

The invention provides the benefit of an induction device for components which are able to break down. The device is inexpensive, small in size, consumes little power, and is very reliable. The breakdown is established after the circuit has been encapsulated, and is induced via the conventional pins, such as ground, supply and input/output pins. The breakdown requires no additional pins.

Figure 6:
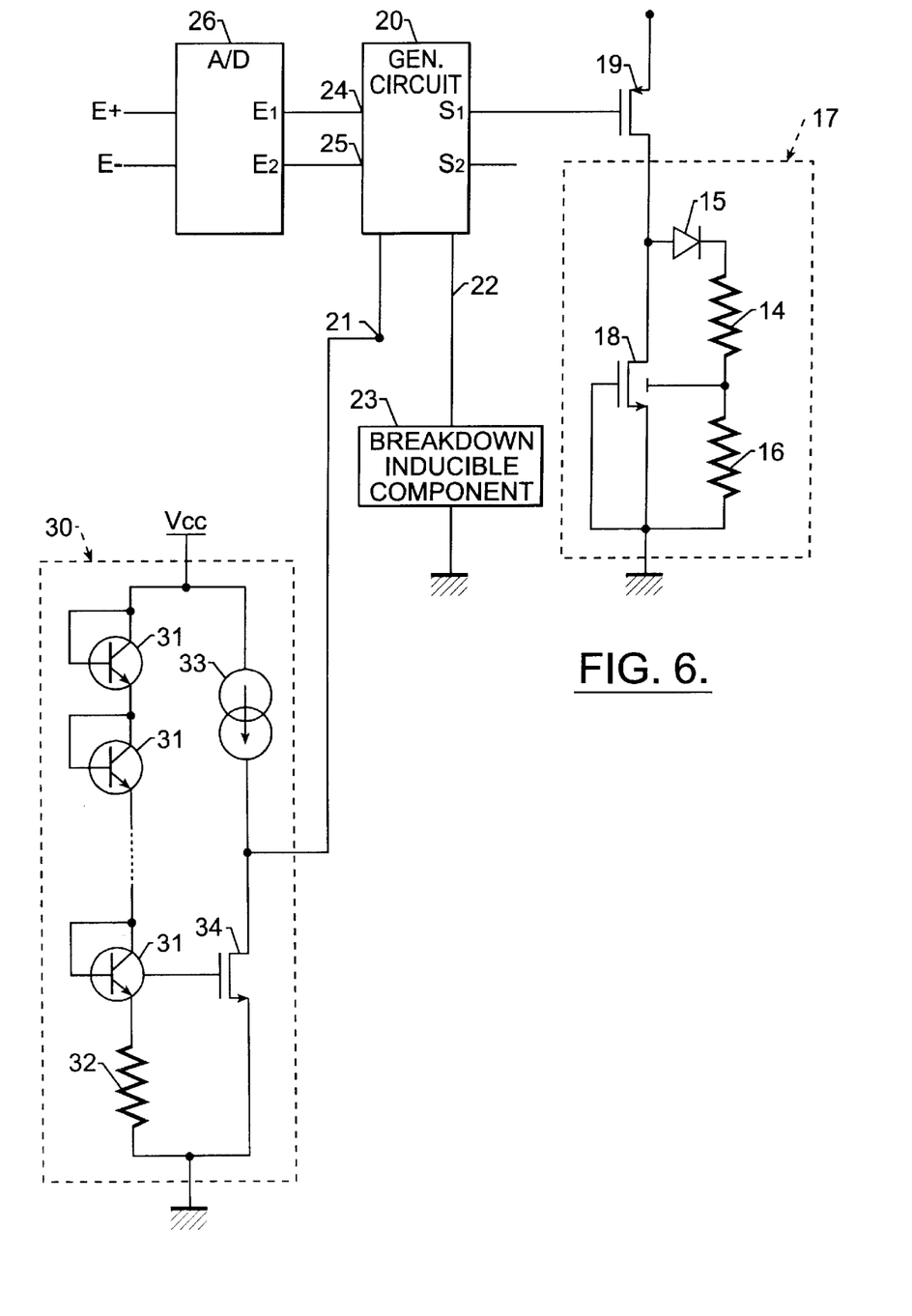
FIG. 6 is a diagram of another embodiment of the component provided with breakdown-inducing means illustrated in FIG. 4.

In the variation illustrated in FIG. 6, a module 30 is connected to the generating means 20 to measure the parameter to be adjusted, such as the voltage Vio for an operational amplifier mounted as a comparator. This may be performed in a circuit-adjustment phase during a final sorting operation.

The module 30 comprises a plurality of n diodes 31 connected in series between a supply voltage and a resistor 32 connected to ground. A current source 33 is connected in series with an n-MOS transistor 34 between a supply voltage and ground. The gate of the transistor 34 is connected to the common point between the resistor 32 and the series of n diodes 31.

For a standard supply voltage, such as 5 volts, for example, the transistor 34 is off. Hence a logic 1 level is applied to terminal 21, thereby inhibiting any selection of a component 17. A higher voltage, which depends on the number n of diodes 31, turns the transistor 34 on. Hence a logic 0 level on terminal 21 and the possibility of selecting a component 17, the selection of which may result in voltage oscillations in the generating means 20, are necessary for an accurate voltage measurement.

The module 30 makes it possible to inhibit the generating means 20 and, therefore, turn off the transistor 19 for controlling the breakdown-inducible component 17. The generating means 20 is inhibited for a voltage which is always less than or equal to the nominal supply voltage of the circuit. Above the voltage fixed by the module 30, the transistor is turned on and, consequently, so is the breakdown-inducible component 17 just before reaching the breakdown voltage.

The module 30 therefore makes it possible, first, to measure the parameter to be adjusted for supply voltages less than the switching voltage of the module 30. Second, to adjust the parameter for the supply voltage greater than the voltage of the module 30. In the industrial phase, it is difficult without the module 30 to measure the parameter accurately since, with the adjustment device being active, the measurement is falsified by the selection of a structure.

At the end of the final sorting, with the adjustment having been made, the irreversible inhibition process is carried out by the breakdown- inducible component 23 which turns off, once and for all, the adjustment structures. Thus, it is possible to measure the parameter to be adjusted before the irreversible inhibition. The module 30 makes it possible to turn off the components 17.

That which is claimed is:

1. An integrated circuit comprising:
   a substrate;
   a MOS transistor comprising a source, a drain, and a gate on said substrate, said MOS transistor defining a parasitic bipolar transistor with said substrate;
   a first resistor connected between said substrate and said source;

a second resistor connected between said substrate and said drain; and a diode connected in series with said second resistor between said substrate and said drain;

said gate and said source being connected together so that application of a voltage between said drain and said source biases a base/emitter junction of the parasitic bipolar transistor and a prebiasing voltage is applied to said substrate for breaking down said MOS transistor.

2. An integrated circuit according to claim 1, wherein an avalanche of a drain/substrate junction, an irreversible breakdown of a drain/substrate junction, and a short circuit between said drain and said source causes breakdown of said MOS transistor.

3. An integrated circuit according to claim 1, wherein the breakdown of said MOS transistor forms an electrical resistance.

4. An integrated circuit according to claim 3, wherein a value of the electrical resistance is determined by a current generated by the applied voltage.

5. An integrated circuit according to claim 1, wherein said integrated circuit comprises a plurality of connection pins; and wherein the breakdown of said MOS transistor is induced via at least one connection pin.

6. An integrated circuit according to claim 1, wherein said diode allows a current to pass from said drain to said substrate.

7. An integrated circuit comprising:

a substrate;

a MOS transistor comprising a source, a drain, and a gate on said substrate, said MOS transistor defining a parasitic bipolar transistor with said substrate;

a first resistor connected between said substrate and said source;

a second resistor connected between said substrate and said drain;

a diode connected in series with said second resistor between said substrate and said drain; and said gate and said source being connected together with said MOS transistor being broken down to thereby define an electrical resistance.

8. An integrated circuit according to claim 7, wherein a value of the electrical resistance is determined by a current generated by a voltage applied between said drain and said source of said MOS transistor.

9. An integrated circuit according to claim 7, wherein the base/emitter junction of the parasitic bipolar transistor is biased based upon an applied voltage between said drain and said source of said MOS transistor.

10. An integrated circuit according to claim 7, wherein said integrated circuit comprises a plurality of connection pins; and wherein the breakdown of said MOS transistor is induced via at least one of connection pin.

11. An integrated circuit according to claim 7, wherein said diode allows a current to pass from said drain to said substrate.

12. An induction device for inducing a breakdown of a circuit, the induction device comprising:

an analog/digital converter for digitizing a voltage reference;

a generating circuit connected to an output of said analog/digital converter for generating a control signal based upon the digitized voltage reference; and a switch connected to said generating circuit and being controlled based upon the control signal, said switch having a first terminal connected to a first voltage reference and a second terminal to be connected to the circuit.

13. An induction device according to claim 12, further comprising a reversible turn-off circuit connected to said generating circuit.

14. An induction device according to claim 12, further comprising an irreversible turn-off circuit connected to said generating circuit, said irreversible turn-off circuit comprising a breakdown inducible circuit.

15. An induction device according to claim 12, wherein the circuit comprises a diode.

16. An induction device according to claim 15, wherein said circuit comprises a Zener diode.

17. An induction device according to claim 12, wherein the circuit comprises at least one MOS transistor.

18. An induction device according to claim 12, wherein the circuit comprises:

a substrate;

a MOS transistor including a source, a drain, and a gate on said substrate, and defining a parasitic bipolar transistor with said substrate;

a first resistor connected between said substrate and said source;

a second resistor connected between said substrate and said drain; and a diode connected in series with said second resistor between said substrate and said drain; said gate and said source being connected together so that application of a voltage between said drain and said source biases a base/emitter junction of the parasitic bipolar transistor for breaking down the MOS transistor.

19. An induction device according to claim 18, wherein an avalanche of a drain/substrate junction, an irreversible breakdown of a drain/substrate junction, and the connection between the drain and the source causes breakdown of the MOS transistor.

20. An induction device according to claim 18, wherein the breakdown of the MOS transistor forms an electrical resistance.

21. An induction device according to claim 12, further comprising a turn-off circuit for inhibiting said generating circuit so that a circuit parameter can be measured prior to a breakdown of the circuit.

* * * * *

UNITED STATES PATENT AND TRADEMARK OFFICE
CERTIFICATE OF CORRECTION

PATENT NO. : 6,410,398 B1
DATED : June 25, 2002
INVENTOR(S) : Christophe Forel, Sebastien Laville and Serge Pontarollo It is certified that error appears in the above-identified patent and that said Letters Patent is hereby corrected as shown below:

<u>Title page,</u>
Item [56], U.S. PATENT DOCUMENTS, insert
-- 5,065,132  11/1991  Taddiken et al. ..........338/334

FOREIGN PATENT DOCUMENTS
JP        55042348        3/1980 --

<u>Column 5,</u>
Line 65, delete "voltage of" insert -- voltage. Of --

<u>Column 7,</u>
Line 66, delete "has has" insert -- has --

<u>Column 9,</u>
Line 55, delete "one of connection" insert -- one connection --

Signed and Sealed this

Fourth Day of February, 2003

JAMES E. ROGAN
*Director of the United States Patent and Trademark Office*